United States Patent
Arnold et al.

(10) Patent No.: US 9,196,958 B2
(45) Date of Patent: Nov. 24, 2015

(54) ANTENNA STRUCTURES AND SHIELD LAYERS ON PACKAGED WIRELESS CIRCUITS

(75) Inventors: Shawn Xavier Arnold, San Jose, CA (US); Dennis R. Pyper, San Jose, CA (US); Jeffrey M. Thoma, Mountain View, CA (US); Scott P. Mullins, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 470 days.

(21) Appl. No.: 13/559,509

(22) Filed: Jul. 26, 2012

(65) Prior Publication Data
US 2014/0028518 A1  Jan. 30, 2014

(51) Int. Cl.
*H01Q 1/52* (2006.01)
*H01Q 1/22* (2006.01)
*H01Q 1/24* (2006.01)

(52) U.S. Cl.
CPC ............. *H01Q 1/526* (2013.01); *H01Q 1/2283* (2013.01); *H01Q 1/243* (2013.01)

(58) Field of Classification Search
CPC ....... H01Q 1/52; H01Q 1/526; H01Q 1/2283; H01Q 1/243; H01L 23/552; H05K 1/0216
USPC .................... 343/841, 700 MS, 702
See application file for complete search history.

(56) References Cited

U.S. PATENT DOCUMENTS

| | | | |
|---|---|---|---|
| 6,770,955 B1 * | 8/2004 | Coccioli et al. | 257/659 |
| 7,049,682 B1 * | 5/2006 | Mathews et al. | 257/660 |
| 7,250,867 B2 | 7/2007 | Sakama et al. | |
| 7,852,281 B2 * | 12/2010 | Choudhury | 343/851 |
| 8,199,518 B1 | 6/2012 | Chun et al. | |
| 8,237,248 B2 | 8/2012 | Yamazaki et al. | |
| 8,502,735 B1 * | 8/2013 | Moosbrugger et al. | 343/700 MS |
| 2002/0167060 A1 * | 11/2002 | Buijsman et al. | 257/423 |
| 2008/0265038 A1 | 10/2008 | Mumbru Forn et al. | |
| 2012/0104574 A1 | 5/2012 | Boeck et al. | |
| 2013/0093629 A1 * | 4/2013 | Chiu et al. | 343/700 MS |
| 2013/0324069 A1 * | 12/2013 | Chen et al. | 455/334 |

* cited by examiner

*Primary Examiner* — Hoanganh Le
(74) *Attorney, Agent, or Firm* — Treyz Law Group; G. Victor Treyz; Michael H. Lyons

(57) ABSTRACT

An electronic device may be provided with antenna structures. Circuitry such as radio-frequency transceiver circuitry and impedance matching and filter circuitry may be implemented using one or more circuit components and embedded within an insulator to form packaged circuitry. The insulator may be formed from multiple layers of printed circuit board material or from plastic molded onto a printed circuit board substrate over the circuitry. A metal shield layer may be interposed between the packaged circuitry and the antenna structures. The metal shield layer may be mounted on the surface of the packaged circuitry using a layer of adhesive. A layer of polymer may be interposed between the layer of adhesive and the metal shielding layer. The metal shield layer may have an opening through which conductive paths may pass to couple the packaged circuitry to antenna terminals on the antenna structures.

29 Claims, 19 Drawing Sheets

ANTENNA STRUCTURES AND SHIELD LAYERS ON PACKAGED WIRELESS CIRCUITS

BACKGROUND

This relates to electrical systems and, more particularly, to systems with antenna structures and associated circuitry.

Electronic devices such as computers, media players, cellular telephones, and other portable electronic devices often contain wireless circuitry. For example, cellular telephone transceiver circuitry and wireless local area network circuitry may allow a device to wirelessly communicate with external equipment. Antenna structures may be used in transmitting and receiving associated wireless signals.

It can be challenging to incorporate wireless circuitry into an electronic device. Space is often at a premium, particularly in compact devices. The presence of metal in device components and on printed circuit boards may affect antenna performance. If care is not taken, antenna structures may not perform satisfactorily or may consume more space within an electronic device than desired.

It would therefore be desirable to be able to provide improved wireless circuitry such as wireless circuitry that includes antenna structures and associated wireless circuit components.

SUMMARY

An electronic device may be provided with wireless circuitry. The wireless circuitry may include antenna structures for transmitting and receiving wireless signals. The wireless circuitry may also include one or more circuits such as radio-frequency transceiver circuits and impedance matching and filter circuitry. These circuits may be implemented using one or more silicon integrated circuit die. The silicon integrated circuit die may be thinned to less than 500 microns in thickness, less than 200 microns in thickness, or less than 75 microns in thickness (as examples).

Transceiver circuitry and impedance matching and filter circuitry may be embedded within an insulator to form packaged circuitry. The insulator may be formed from multiple layers of printed circuit board material or from plastic that has been molded onto a printed circuit board over the circuitry.

A conductive shield such as a metal shield layer may be interposed between the packaged circuitry and the antenna structures. The metal shield layer may be mounted on the surface of the packaged circuitry using a layer of adhesive. A layer of polymer may be interposed between the layer of adhesive and the metal shielding layer. The metal shield layer may be formed from a metal coating on the layer of polymer. The shield may have an opening through which conductive paths may pass. The conductive paths may be used to couple antenna terminals in the antenna structures to circuit components in the packaged circuitry. The packaged circuitry and other components may be mounted to a printed circuit board.

Further features of the invention, its nature and various advantages will be more apparent from the accompanying drawings and the following detailed description of the preferred embodiments.

DETAILED DESCRIPTION

Electronic devices often contain wireless circuitry. The wireless circuitry may include radio-frequency transceiver circuitry and associated antenna structures for transmitting and receiving wireless signals. To minimize size while satisfying wireless performance constraints, it may be desirable to implement wireless components using a stacked arrangement in which antenna structures are mounted on a transceiver and other wireless circuits. The wireless circuits may include one or more integrated circuits and one or more other components such as resistors, capacitors, inductors, filters, and switches. Wireless circuits may be embedded within a printed circuit or may be packaged using other structures. A metal shielding layer may be interposed between the packaged wireless circuits and the antenna structures.

Figure 1:
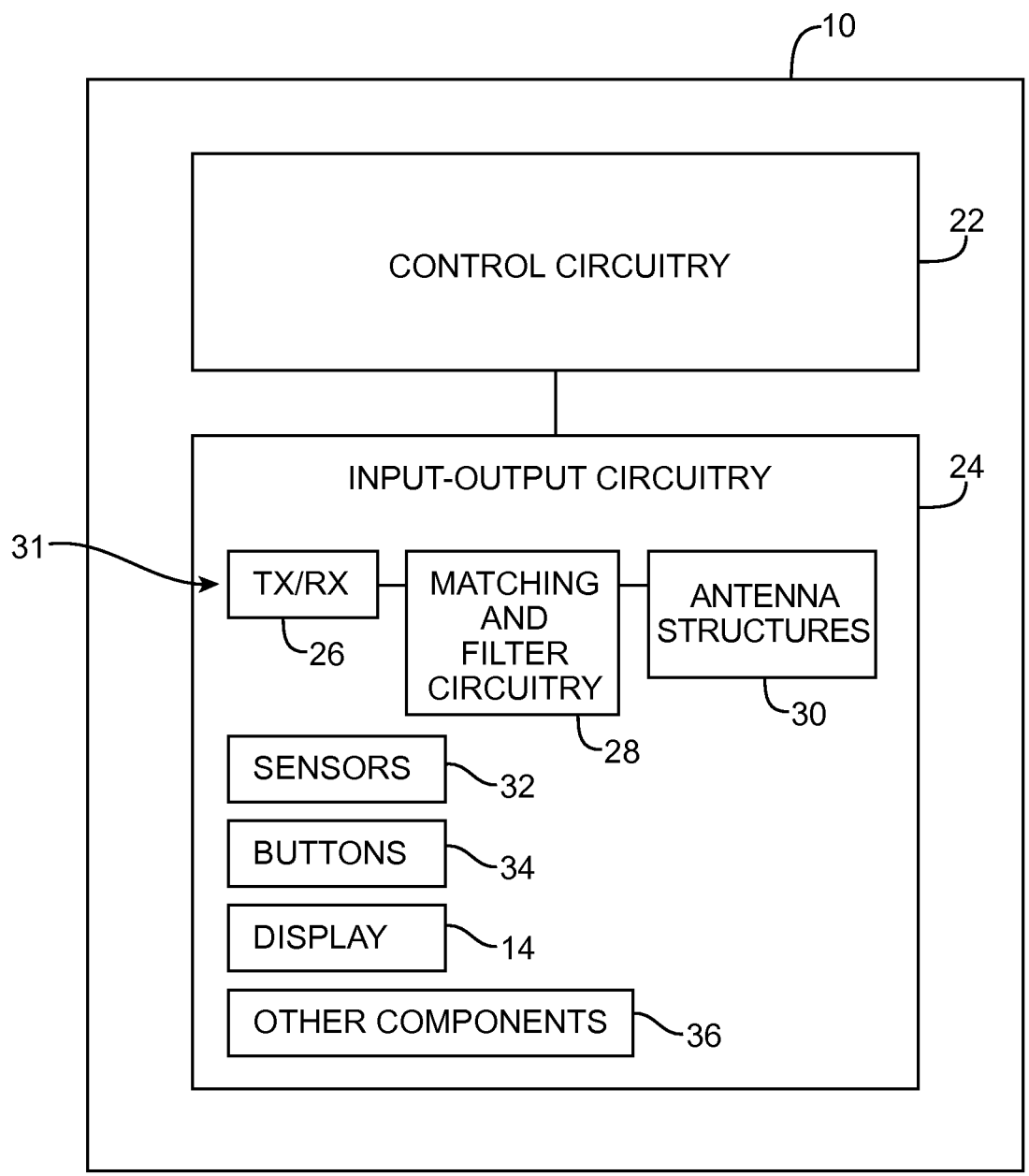
FIG. 1 is a schematic diagram of an illustrative electronic device containing wireless circuitry in accordance with an embodiment of the present invention.

An illustrative device of the type that may have wireless circuitry that includes antenna structures, a shielding layer, and associated wireless circuits is shown in FIG. 1. As shown in FIG. 1, electronic device 10 may include control circuitry 22 and associated input-output circuitry 24.

Control circuitry 22 may include storage and processing circuitry that is configured to execute software that controls the operation of device 10. Control circuitry 22 may include microprocessor circuitry, digital signal processor circuitry, microcontroller circuitry, application-specific integrated circuits, and other processing circuitry. Control circuitry 22 may also include storage such as volatile and non-volatile memory, hard-disk storage, removable storage, solid state drives, random-access memory, memory that is formed as part of other integrated circuits such as memory in a processing circuit, etc.

Input-output circuitry 24 may include components for receiving input from external equipment and for supplying output. For example, input-output circuitry 24 may include user interface components for providing a user of device 10 with output and for gathering input from a user. As shown in FIG. 1, input-output circuitry 24 may include wireless circuitry 31. Wireless circuitry 31 may be used for transmitting and/or receiving signals in one or more communications bands such as cellular telephone bands, wireless local area network bands (e.g., the 2.4 GHz and 5 GHz IEEE 802.11 bands), satellite navigation system bands, etc.

Wireless circuitry 31 may include transceiver circuitry such as radio-frequency transceiver 26. Radio-frequency transceiver 26 may include a radio-frequency receiver and/or a radio-frequency transmitter. Radio-frequency transceiver circuitry 26 may be used to handle wireless signals in communications bands such as the 2.4 GHz and 5 GHz WiFi® bands, cellular telephone bands, and other wireless communications frequencies of interest.

Radio-frequency transceiver circuitry 26 may be coupled to one or more antennas in antenna structures 30 using circuitry 28. Circuitry 28 may include impedance matching circuitry, filter circuitry, switches, and other circuits. Circuitry 28 may be implemented using one or more components such as integrated circuits, discrete components (e.g., capacitors, inductors, and resistors), surface mount technology (SMT) components, or other electrical components. Antenna structures 30 may include inverted-F antennas, patch antennas, loop antennas, monopoles, dipoles, or other suitable antennas.

Sensors 32 may include an ambient light sensor, a proximity sensor, touch sensors such as a touch sensor array for a display and/or touch buttons, pressure sensors, temperature sensors, accelerometers, gyroscopes, and other sensors.

Buttons 34 may include sliding switches, push buttons, menu buttons, buttons based on dome switches, keys on a keypad or keyboard, or other switch-based structures.

Display 14 may be a liquid crystal display, an organic light-emitting diode display, an electrophoretic display, an electrowetting display, a plasma display, or a display based on other display technologies.

Device 10 may also contain other components 36 (e.g., communications circuitry for wired communications, status indicator lights, vibrators, etc.).

Antenna structures 30 may be formed using conductive structures such as patterned metal foil or metal traces. The conductive structures of antenna structures 30 may be supported by ceramic carriers, plastic carriers, and printed circuits (as examples). Conductive materials for antenna structures 30 such as metal may, for example, be supported on dielectric substrates such as injection-molded plastic carriers, glass or ceramic members, or other insulators. If desired, antenna structures 30 may include passive components such as matching circuits, filter circuits, or other passive components such as resistors, inductors, capacitors, etc. The passive components and the conductive antenna structures may be formed on a substrate such as a silicon substrate. Arrangements in which passive components such as conductive antenna structures and matching circuits are formed on a silicon substrate may sometimes be referred to as integrated passive devices (IPDs).

If desired, patterned metal traces for an antenna may be formed on printed circuit substrates. An antenna may be formed, for example, using metal traces on a printed circuit such as a rigid printed circuit board (e.g., a fiberglass-filled epoxy board) or on a flexible printed circuit formed from a sheet of polyimide or other flexible polymer layer. Antenna structures that are formed on printed circuit substrates may be mounted to support structures such as plastic support structures or other dielectric support structures. Antenna structures that are formed using ceramic supports may sometimes be referred to as ceramic antennas or chip antennas. In general, any suitable type of antenna structures may be used in device 10, if desired. Antenna structures 30 may, for example, be implemented using a ceramic antenna (e.g., a chip antenna), an antenna with traces formed on a flexible printed circuit substrate, an antenna with traces formed on a rigid printed circuit substrate, an antenna with traces formed on a plastic carrier, an antenna with traces on a glass carrier, etc.

Figure 2:
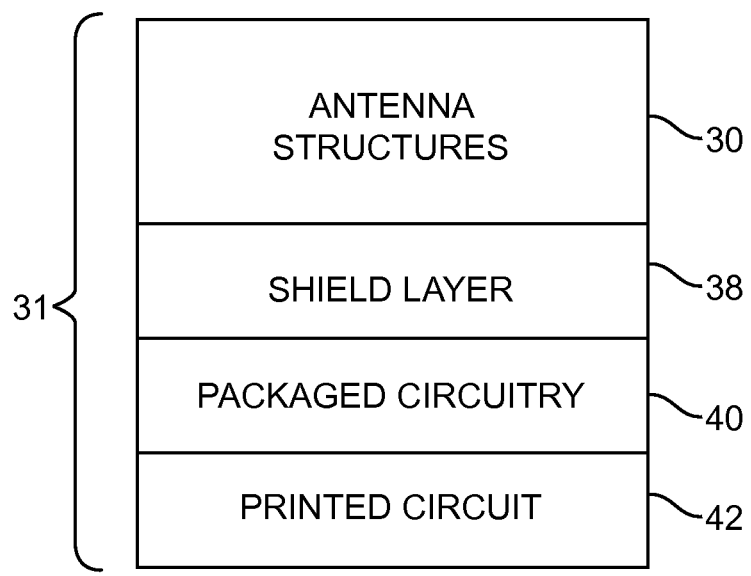
FIG. 2 is a diagram showing how a shield may be interposed between antenna structures and associated wireless circuit components in accordance with an embodiment of the present invention.

It may be desirable to mount antenna structures 30 on top of wireless circuits such as circuitry 26 and 28. To prevent electromagnetic interference, a conductive electromagnetic shielding layer may be interposed between antenna structures 30 and these wireless circuits. As shown in FIG. 2, for example, wireless circuitry 31 may include antenna structures 30 mounted on shield layer 38. Shield layer 38 may, in turn, be mounted on packaged wireless circuits 40 such as transceiver circuitry 26 and/or impedance matching and filter circuitry 28. Circuits 40 may have integrated circuit die and other electrical components that are embedded within a printed circuit substrate, that are encapsulated within a molded plastic package, or that are packaged using other packaging structures and may therefore sometimes be referred to as packaged wireless circuits or packaged circuitry.

Packaged wireless circuitry 40 may be mounted on a plastic carrier, a ceramic or glass carrier, or a printed circuit substrate (as examples). As shown in FIG. 2, for example, packaged circuitry 40 may be mounted on printed circuit 42. If desired, other circuitry (e.g., control circuitry 22 or circuitry 24) may be mounted on printed circuit 42.

Using a configuration of the type shown in FIG. 2, wireless circuitry 31 may be implemented in a relatively compact space while satisfying wireless performance constraints. Shield layer 38 (which may, if desired, form part of an antenna ground for antenna structures 30) may be implemented using a layer of metal such as a copper foil layer or a layer of silver paint or other conductive material. Shield layer 38 may have a relatively small thickness (e.g., a thickness of less than 2 mm, less than 1 mm, less than 0.5 mm, less than 0.1 mm, less than 0.05 mm, or less than 0.01 mm). As a result, antenna structures 30 may be formed in close proximity to packaged circuitry 40. When transmitting and receiving wireless signals, the close proximity of packaged circuitry 40 and antenna structures 30 may help to reduce signal losses associated with the signal paths between packaged circuitry 40 and antenna structures 30. Because antenna structures 30 and packaged circuitry 40 may be implemented as part of the same component "footprint" on printed circuit 42, the area on printed circuit 42 that is consumed by the components of wireless circuitry 31 may be minimized relative to configurations in which antenna structures 30 do not overlap packaged circuitry 40.

In configurations of the type shown in FIG. 2, antenna structures 30, shield layer 38, and packaged circuitry 40 may form an integrated wireless structure on printed circuit 42 and may therefore sometimes be referred to as a circuit module. Integrated circuit modules of this type may be provided with any suitable type of antenna structures, shields, and packaged circuits. For example, antenna structures 30 may contain inverted-F antenna structures, planar inverted-F antenna structures, monopole antenna structures, dipole antenna structures, patch antenna structures, structures associated with a loop antenna, or other antenna structures. Antenna structures 30 may be formed from a ceramic antenna structure (i.e., a ceramic chip antenna), a flexible printed circuit with antenna traces, a rigid printed circuit with antenna traces, a plastic carrier covered with traces that have been patterned using laser direct structuring or other patterning techniques, or other dielectric support structures. Shield layer 38 may be formed from one or more layers of metal or other conductive materials. The layers of metal may be formed from sheets of metal foil, from metal coatings on polymer layers, or from other metal layers. Packaged circuitry 40 may be formed from circuitry such as one or more integrated circuits (i.e., an integrated circuit die formed from a piece of silicon that has been thinned to a thickness of less than 500 microns, less than 200 microns, less than 75 microns, or other suitable thickness) and other electrical components that are embedded in an insulating structure. The insulating structure may be a printed circuit substrate (e.g., a multilayer printed circuit substrate), circuitry that is packaged in a molded plastic encapsulant structure, or circuitry that is packaged in other suitable packages (e.g., surface mount technology packages, etc.).

Figure 3:
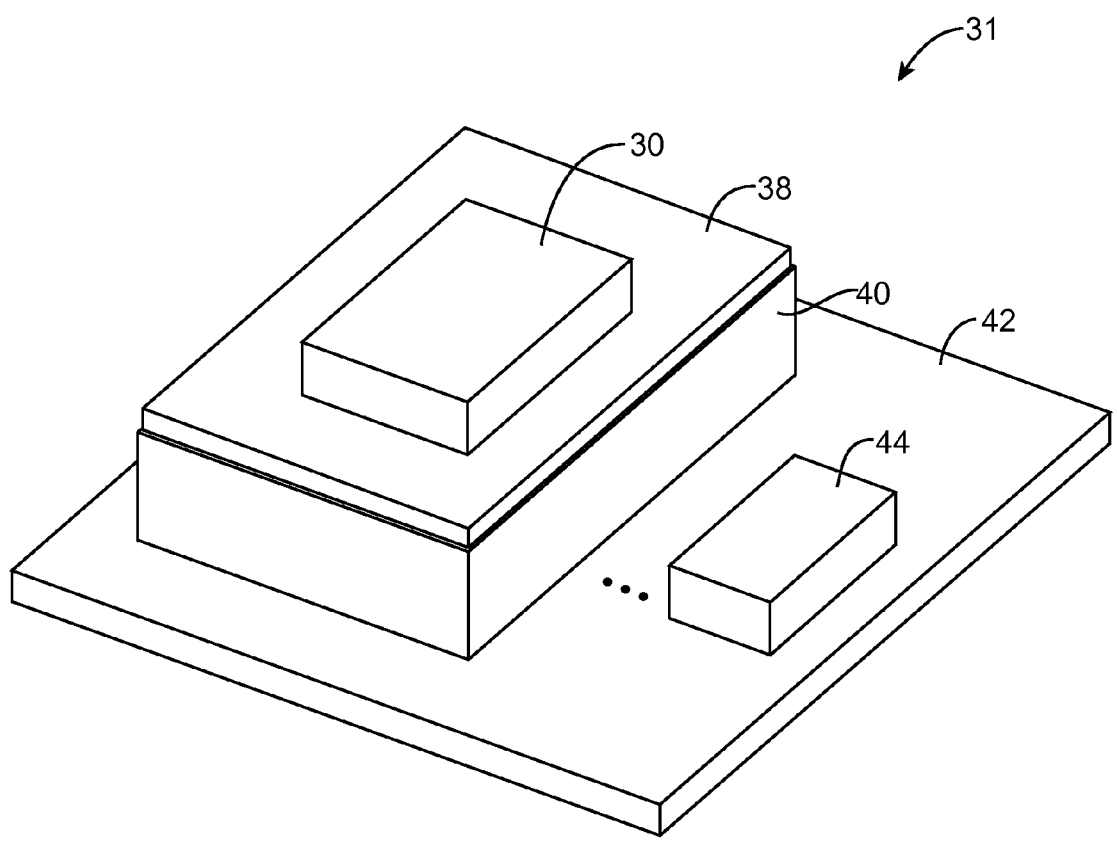
FIG. 3 is a perspective view of illustrative antenna structures mounted on shield structures that have been formed on the top of a packaged wireless circuit in accordance with an embodiment of the present invention.

FIG. 3 is a perspective view showing how wireless shield layer 38 may be formed from a layer of metal or other conductive material that covers the upper surface of packaged circuitry 40 and that is interposed between antenna structures 30 and packaged circuitry 40. Packaged circuitry 40 may be mounted on printed circuit 42 (e.g., using solder connections or other conductive connections such as conductive connections formed from conductive adhesive). Additional components 44 such as one or more integrated circuits, discrete components, connectors, or other circuitry may also be mounted on printed circuit board 42. Printed circuit board 42 may be a rigid printed circuit board (e.g., a board formed from fiberglass-filled epoxy) or may be a flexible printed circuit ("flex circuit") formed from a polyimide substrate or other flexible polymer layers. In the example of FIG. 3, the amount of surface area consumed by antenna structures 30 is less than the amount of surface area on the upper surface of packaged circuitry 40 and is less than the size of shield 38. This is merely illustrative. If desired, antenna structures 30 may cover more of the surface of shield 38 and/or packaged circuitry 40.

Figure 4A:
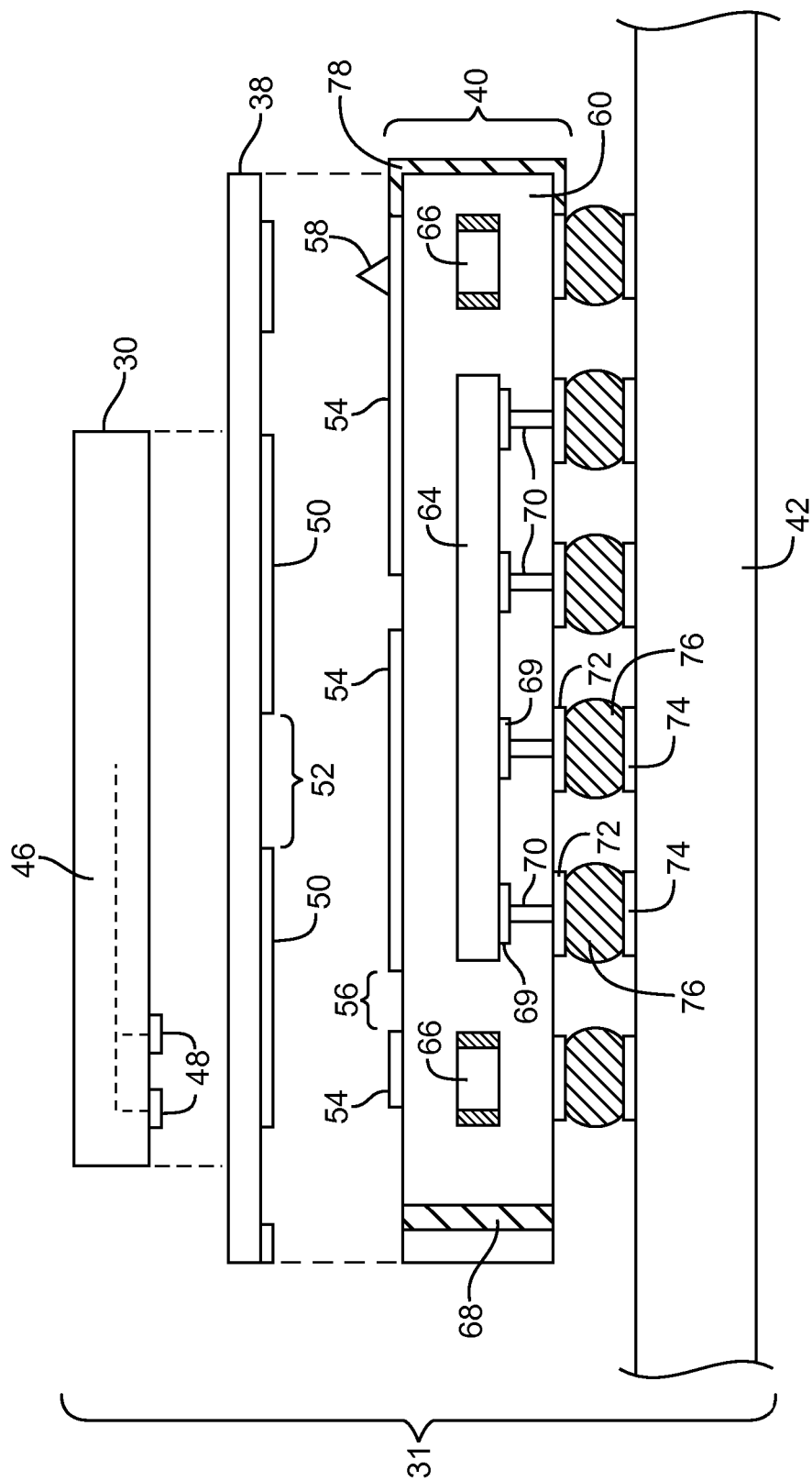
FIG. 4A is an exploded perspective view of an illustrative wireless circuit module having an electromagnetic shield layer interposed between an antenna and associated wireless circuitry in accordance with an embodiment of the present invention.

FIG. 4A is a cross-sectional side view of wireless circuitry 31 showing how packaged circuitry 40 may be formed by embedding components within a dielectric material. As shown in FIG. 4A, packaged circuitry 40 may include one or more electrical components such as integrated circuit 64 and other components 66 (e.g., integrated circuits, discrete components such as inductors, capacitors, or resistors, switches, etc.). The circuitry of integrated circuits such as circuit 64 and other electrical components 66 may be used to implement circuitry such as radio-frequency transceiver circuitry 26 and impedance matching and filter circuitry 28 (see, e.g., FIG. 1). Material 60 may include one or more insulating (dielectric) materials such as polymers (e.g., polyimide, epoxy or other resins, thermoset plastics, thermoplastic plastics, glasses, ceramics, other materials, or combinations of these materials). Material 60 may, if desired, incorporate fibers such as glass fibers (e.g., material 60 may be a printed circuit material such as fiberglass-filled epoxy). Material 60 may be formed from one or more layers. As an example, material 60 may be formed from multiple layers of printed circuit board material (e.g., pre-preg) that are cured to form a multilayer printed circuit board.

As shown in FIG. 4A, printed circuit 40 may include patterned metal traces such as upper surface traces 54. Traces 54 and other conductors in packaged circuitry 40 may be formed from metal (e.g., copper, gold, aluminum, etc.). Traces 54 may be formed from patterned metal foil, from metal layers that are deposited using physical vapor deposition equipment, from metal layers that are deposited using chemical vapor deposition, from metal layers grown using electrochemical deposition techniques (e.g., electroplating), or other suitable fabrication methods.

Metal shield 38 may be formed from a metal foil layer, from a deposited metal coating, or from other conductive materials (e.g., metallic paint such as silver paint, etc.). As shown in FIG. 4A, shield layer 38 may be implemented using a sheet of metal that is attached to the upper surface of packaged circuitry 40 using adhesive 50. Layer 38 may have a thickness of less than 1 mm, less than 0.2 mm, less than 0.05 mm, or less than 0.01 mm (as examples). Adhesive 50 may be a patterned layer of pressure sensitive adhesive having openings such as openings 52 (as an example). Openings 52 may allow metal shield structure 38 to be selectively shorted to traces 54 (if desired). Openings 52 may be omitted in configurations in which it is desired to use pressure sensitive adhesive layer 50 to insulate metal shield layer 38 from conductive traces 54. If desired, layer 50 may be formed from one or more other insulating materials (e.g., portions of a molded plastic layer, liquid adhesive layers, layers of glass or ceramic, etc.).

Antenna structures 30 may contain metal traces such as metal traces 46. Metal traces 46 may be formed from metals such as copper, gold, or other metals. Metal traces 46 may be patterned to form one or more antenna resonating elements, parasitic antenna resonating element structures, antenna ground structures, or other suitable conductive antenna structures. Terminals such as terminals 48 may be formed from metal and may be used to couple antenna traces 46 to the circuitry of packaged circuitry 40. For example, terminals 48 may be coupled to traces 54 and/or other traces in packaged circuitry 40.

Packaged circuitry 40 may include one or more layers of conductive traces, two or more layers of conductive traces, three or more layers of conductive traces, or four or more layers of conductive traces. In addition to upper trace layer 54, the interconnects of packaged circuitry 40 may include features such as via 68. Vias such as via 68 may be used to interconnect one or more of the layers of traces in packaged circuitry 40. For example, vias such as via 68 may pass through a single layer of packaged circuitry 40 (e.g., an upper layer of printed circuit board material, an intermediate layer of printed circuit board material, or a lower layer of printed circuit board material), may pass through two or more layers of printed circuit board material in packaged circuitry 40, or may pass through three or more or four or more layers of printed circuit board material in packaged circuitry 40.

As shown in FIG. 4A, vias such as vias 70 may be used to interconnect pads 69 on integrated circuit 64 or other components 66 to other circuitry. As an example, vias 70 may electrically connect pads 69 (e.g., traces on integrated circuit 64) to pads 72 on the lowermost surface of packaged circuitry 40. Pads 72, which may form part of a patterned layer of conductive traces on packaged circuitry 40 may be electrically connected to traces on printed circuit 42 using solder 76 (e.g., connections formed from solder). For example, solder 76 may be used to couple traces 69 to pads formed from traces 74 on the uppermost surface of printed circuit 42. Printed circuit 42 may use traces 74 and/or internal layers of patterned interconnects to couple the circuitry of packaged circuitry 40 such as integrated circuit 64 and electrical components 66 to additional circuitry (see, e.g., electrical components such as circuitry 44 of FIG. 3).

Vias such as via 68 and layers of interconnects in packaged circuitry 40 may be used to route signals between the embedded components in packaged circuitry 40 and antenna structures 30 and to route signals between the embedded components in packaged circuitry 40 and the circuitry of printed circuit 42. If desired, packaged circuitry 40 may include edge conductors such as edge conductor 78 of FIG. 4A. Edge conductor 78 may be formed from a metal such as copper and may be formed on the edge of the printed circuit board layers of other insulating material of packaged circuitry 40 using electroplating, laser-based patterning techniques, or other fabrication techniques for depositing metal on dielectric materials. As an example, when the layers of material that form packaged circuitry 40 are joined together (e.g., as part of a single board of printed circuit board material that includes numerous embedded circuits) a cutter such as a router bit may be used to cut a groove that runs along one or more of the edges of packaged circuitry 40. The surfaces of these grooves may then be coated with metal using electroplating (as an example). Interconnects for packaged circuitry 40 may also be formed using wire bonding wires and associated wire bonds, solder balls (e.g., solder balls in a flip-chip packaging scheme), metal leads (e.g., stamped metal leads that have been insert molded in a plastic package), patterned metal foil, wires, through-silicon vias, or other conductive structures. The configuration of FIG. 4A in which vertical conductive paths have been formed using edge conductive structures 78 and vias such as via 68 and vias 70 is merely illustrative.

The interconnects and other patterned structures of packaged circuitry 40 may be formed by coupling multiple layers of printed circuit board material (e.g., pre-preg layers and/or cured layers of fiberglass-filled epoxy) that include patterned conductive traces. Laser drilling, mechanical drilling, electroplating, photolithography, and other fabrication techniques may also be used in forming packaged circuitry 40.

Solder connections 76 between packaged circuitry 40 and printed circuit board 42 may be formed having predetermined (or minimum) spacing between each adjacent pair of solder connections 76. For example, the minimum spacing between connections 76 may be constrained by manufacturing tolerances of tools (equipment) used to form packaged circuitry 40. The spacing between adjacent pair of solder connections 76 may sometimes be referred to as pitch. The pitch of packaged circuitry 40 may also determine the spacing between pads 72 corresponding to connections 76. In some scenarios, packaged circuitry 40 may include components or integrated circuits that are incompatible with the pitch of packaged circuitry 40. For example, an integrated circuit having a pitch (e.g., spacing between pads on the integrated circuit for receiving solder connections) that is smaller than the pitch of packaged circuitry 40 may be incompatible with direct soldering to pads 72 of packaged circuitry 40.

Figure 4B:
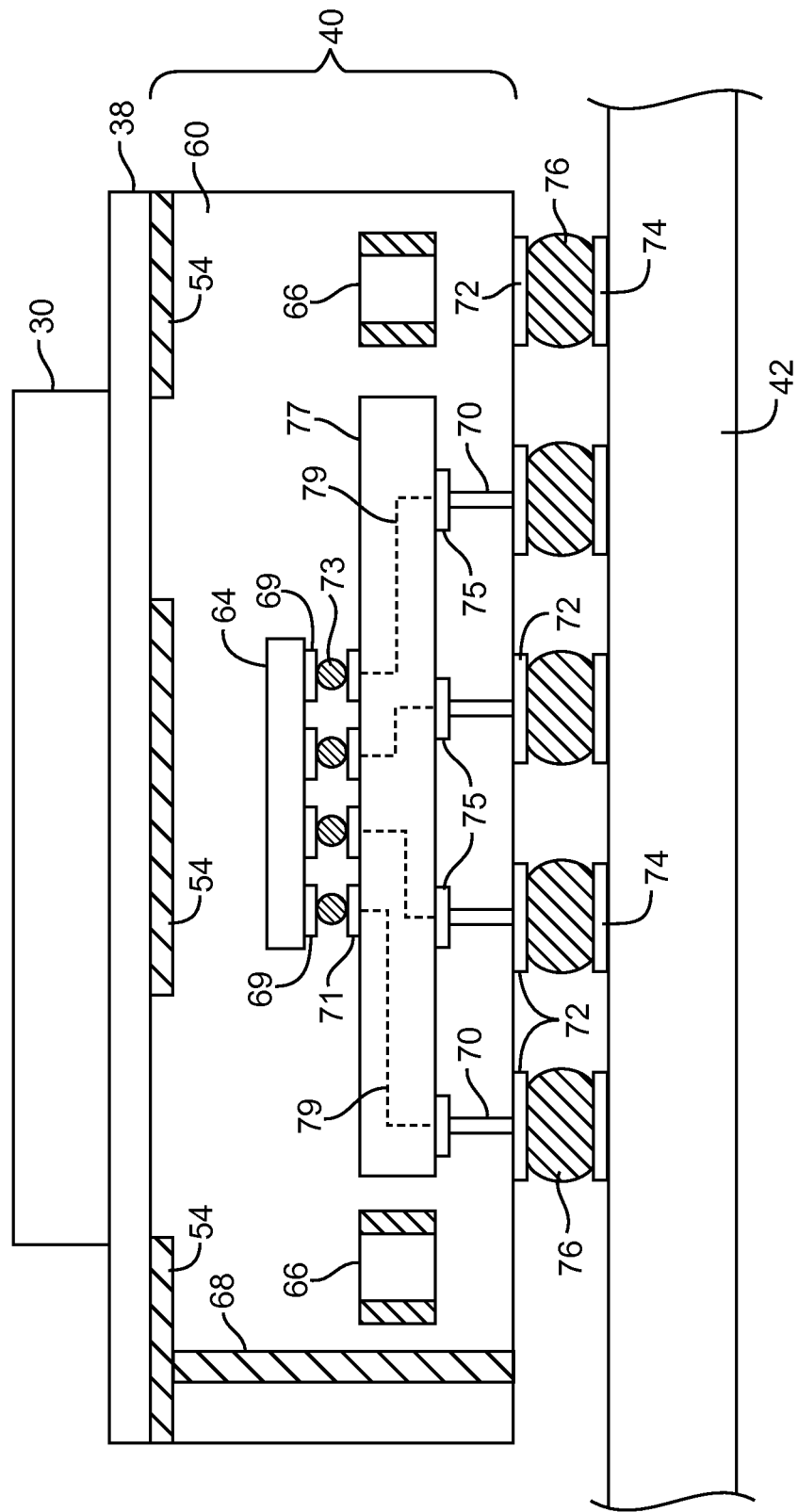
FIG. 4B is a cross-sectional view of an illustrative wireless circuit module having an electromagnetic shield layer, antenna, and wireless circuitry mounted on an intermediate layer in accordance with an embodiment of the present invention.

Packaged circuitry 40 may accommodate embedded components using one or more intermediate printed circuit layers within printed circuit material 60. FIG. 4B is an illustrative cross-sectional diagram of packaged circuitry 40 having an intermediate layer 77 within material 60. Intermediate layer 77 may be formed from any desired printed circuit material such as those used to form material 60.

Pads 75 may be formed on a lower surface of intermediate layer 77. Traces (pads) 75 may be formed at a pitch that is compatible with the pitch of pads 72 (e.g., the pitch of traces 75 may be substantially the same as pads 72 of packaged circuitry 40). Vias 70 may electrically couple traces 75 of layer 77 to pads 72 of packaged circuitry 40.

Pads 71 may be formed on an upper surface of layer 77 at a pitch that is compatible with the pitch of integrated circuit 64 (e.g., the pitch of pads 71 may match the pitch of pads 69 of integrated circuit 64). Solder balls 73 may be used to electrically couple pads 69 of integrated circuit 64 with pads 71 of intermediate layer 77 (e.g., an interposing printed circuit layer between integrated circuit 64 and pads 72 of packaged circuitry 40).

Intermediate layer 77 may include traces 79 that electrically couple pads 71 to pads 70. Traces 79 may be used to route signals from integrated circuit 64 to printed circuit 42 through intermediate layer 77. For example, signals from integrated circuit 64 may be provided at pads 69 and may be routed through solder balls 73, pads 71, traces 79, pads 75, vias 70, pads 72, solder balls 76, and pads 74 to reach printed circuit 42. Intermediate layer 77 may sometimes be referred to as an interposer layer.

An illustrative arrangement for forming packaged circuitry 40 from multiple layers of printed circuit material is shown in FIGS. 5, 6, 7, and 8. This approach is merely illustrative. In general, any suitable fabrication process may be used in forming packaged circuitry 40, if desired.

Figure 5:
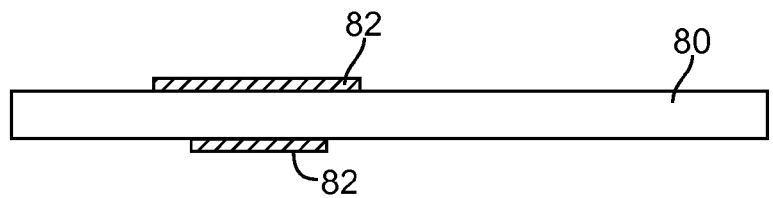
FIG. 5 is a cross-sectional side view of an illustrative two-sided printed circuit in accordance with an embodiment of the present invention.

As shown in FIG. 5, patterned conductive traces such as traces 82 may be formed on the upper and lower surfaces of a layer of printed circuit board material such as layer 80. Layer 80 may be, for example, a cured layer of fiberglass-filled epoxy. Conductive traces 82 may be formed from a metal such as copper (as an example). Photolithography or other patterning techniques may be used in forming patterned traces 82.

Figure 6:
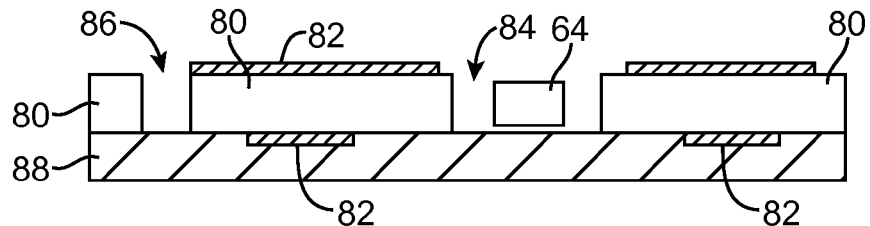
FIG. 6 is a cross-sectional side view of the printed circuit of FIG. 5 following the formation of holes and attachment of a temporary backing layer to hold an integrated circuit die in a hole in accordance with an embodiment of the present invention.

Following formation of printed circuit layer 80 of FIG. 5, openings may be formed in layer 80, as shown by illustrative openings 84 and 86 in FIG. 6. Openings such as openings 84 and 86 may be formed by laser processing, machining (e.g., drilling or other machining techniques using a cutting tool such as a drill bit or milling machine cutter), etching, etc.

Openings such as opening 86 may be used in forming vias. Openings such as opening 84 may be used to receive components such as integrated circuit die 64. As shown in FIG. 6, a temporary support structure such as layer 88 may be used in supporting integrated circuit 64 before upper and lower layers of printed circuit material are added. Layer 88 may be formed from a flexible polymer sheet with a layer of removable adhesive (as an example).

Figure 7:
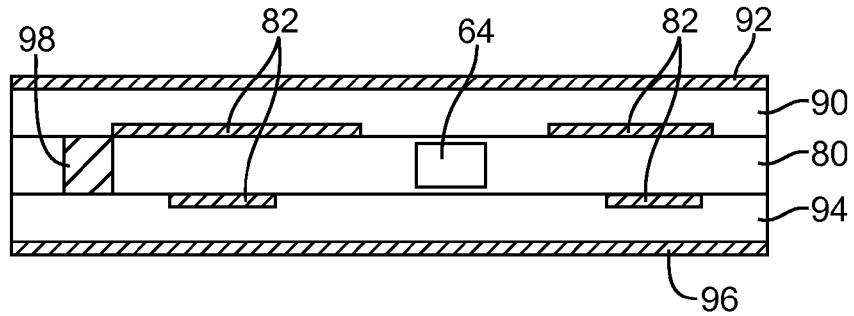
FIG. 7 is a cross-sectional side view of the printed circuit of FIG. 6 following attachment of upper and lower printed circuit pre-preg layers in accordance with an embodiment of the present invention.

While being temporarily held using layer 88, an upper layer of pre-preg such as layer 90 of FIG. 7 (i.e., fiberglass-filled epoxy or other printed circuit board material that has been cured sufficiently to become tacky but that is not completely rigid) may be added to the upper surface of printed circuit layer 80. Temporary layer 88 may then be removed and a lower layer of pre-preg such as layer 94 of FIG. 7 may be added. Conductive materials such as conductive material 98 may be incorporated into vias in layer 80 prior to attachment of layers 90 and 94 (e.g., using via metal layer formation techniques such as electrochemical deposition). Following formation of via metallization 98 and the sandwiching of components such as integrated circuit 64 between upper pre-preg layer 90 and lower pre-preg layer 94 (e.g., using a lamination tool or other lamination equipment), layers 92 and 94 may be cured (e.g., by applying heat using the lamination tool) and metal layers such as metal layer 92 and metal layer 96 may be formed. Metal layers 92 and 96 may be, for example, layers of copper foil that have not been patterned.

Figure 8A:
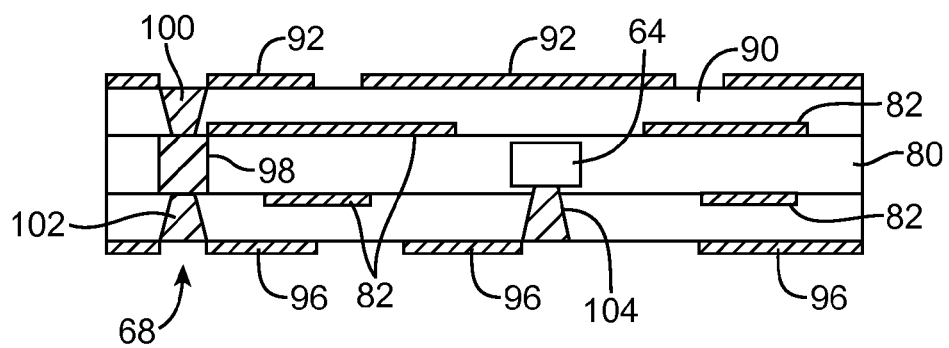
FIG. 8A is a cross-sectional side view of a multi-layer printed circuit formed from structures of the type shown in FIG. 7 in which a component such as an integrated circuit has been embedded within the printed circuit structures by sandwiching the integrated circuit between opposing layers of printed circuit material in accordance with an embodiment of the present invention.

As shown in FIG. 8A, layers 92 and 96 may be patterned (e.g., using photolithography, laser direct imaging, or other patterning techniques) and vias may be formed and filled with a conductive material such as conductive epoxy, metal (e.g., a copper plug), or other conductive materials (see, e.g., vias 100, 102, and 104). Vias such as vias 100, 102, and 104 may be formed by laser drilling, machining, or other via formation techniques. Metal for filling vias such as vias 100, 102, and 104 may be deposited by electroplating and other deposition techniques. Vias such as vias 100 and 102 in the FIG. 8A example have been aligned with via 98 and form a through via such as via 68 (FIG. 4A). Via 104 has been used to couple lower surface patterned trace 96 (e.g., one of traces 72 of FIG. 4A) to integrated circuit 64 (i.e., via 104 may form one of vias 70 of FIG. 4A). Metal 92 of FIG. 8A may form patterned traces 54 of FIG. 4A.

Figure 8B:
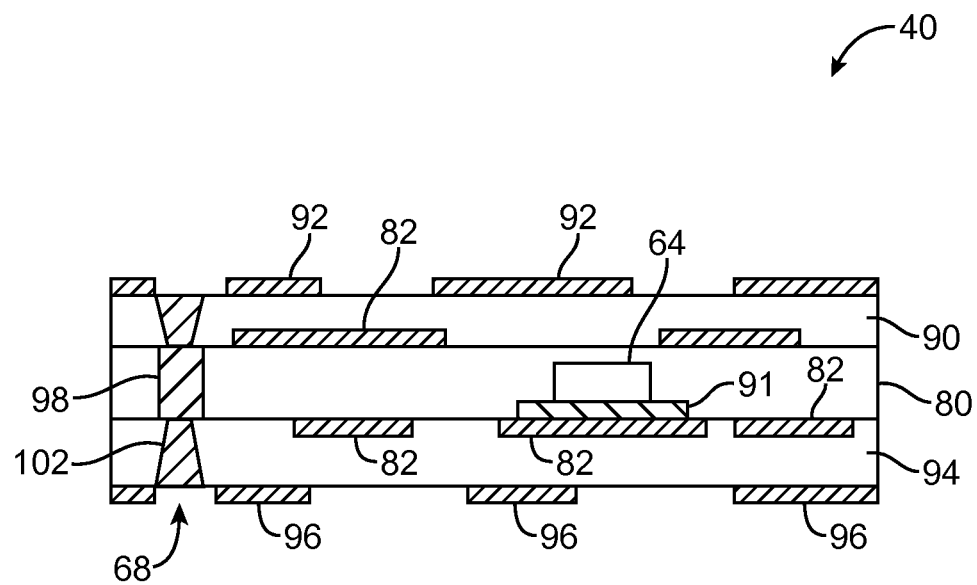
FIG. 8B is a cross-sectional side view of a multi-layer printed circuit in which a component has been mounted on an intermediate printed circuit layer in accordance with an embodiment of the present invention.

If desired, one or more integrated circuit die 64 may be formed on an intermediate layer within packaged components such as components 40. FIG. 8B is an illustrative arrangement of packaged components 40 in which integrated circuit die 64 is formed on an intermediate layer 91. Intermediate layer 85 may be formed from a layer of insulating material (e.g., resin or other insulating materials) deposited over a patterned conductive layer 82. Intermediate layer 85 may be formed by screen printing or other desired deposition techniques.

Figure 9:
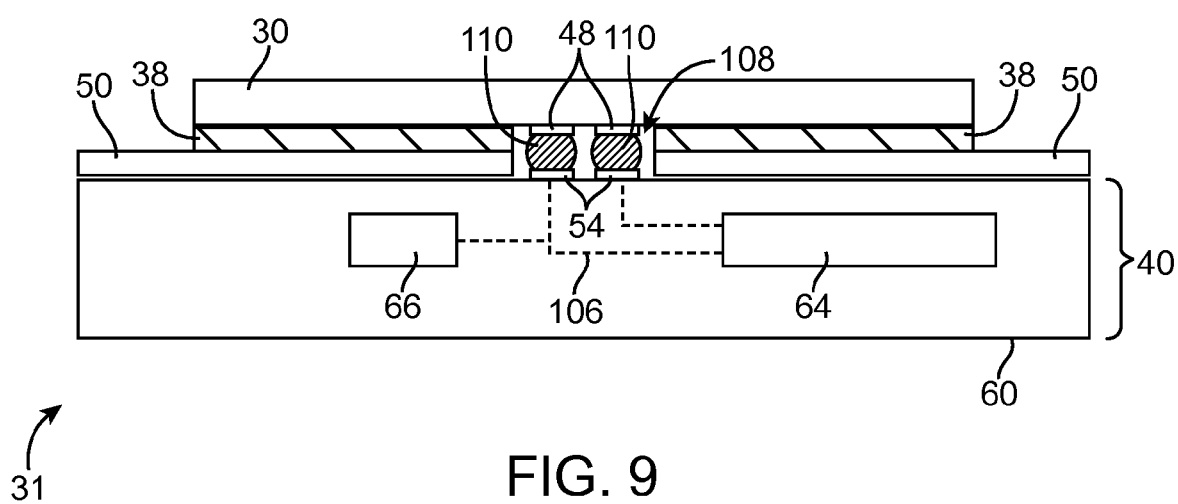
FIG. 9 is a cross-sectional side view of illustrative wireless circuitry having antenna structures attached to a printed circuit with embedded wireless circuitry and having an interposed shield structure with an opening in accordance with an embodiment of the present invention.

As shown in FIG. 9, an opening such as opening 108 may be formed in shield layer 38. Opening 108 may be aligned with an opening in insulating layer 50 (see, e.g., openings 52 in FIG. 4A). Using openings such as openings 108 and 52, conductive structures 110 may form electrical paths that couple terminals 48 of antenna structures 30 to terminals formed from traces 54 on packaged circuitry 40. Conductive structures 110 may be formed from solder, welds, conductive adhesive, or other conductive material. Traces 54 may be coupled to embedded circuitry 64 and 66 in package circuitry 40 using interconnect structures 106 (e.g., horizontal traces, vertical vias, and edge conductors such as those described in connection with FIGS. 4, 5, 6, 7, and 8). Insulating layer 50 may be used to electrically isolate shield layer 30 from traces on packaged circuitry 40. Insulating layer 50 may be formed from pressure sensitive adhesive, other adhesive materials, non-adhesive polymers such as molded plastic layers and/or sheets of polymer, ceramics, glasses, etc.). In the example of FIG. 9, two electrical paths have been formed between antenna structures 30 and packaged circuitry 40. This is merely illustrative. In general, there may be one or more connections, two or more connections, three or more connections, or four or more connections for forming signal paths between packaged circuitry 40 and antenna structures 30. If desired, conductive structures such as solder or other conductive materials 110 may be used in forming paths that do not contact shield layer 38 and/or paths that contact shield layer 38.

Figure 10:
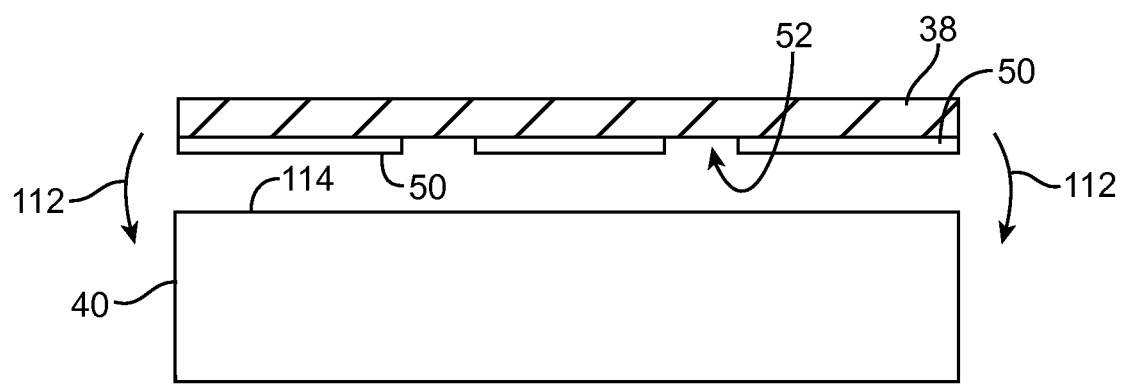
FIG. 10 is a cross-sectional side view of a shield that has been formed from a layer of conductor on a patterned adhesive layer being installed on a wireless circuit in accordance with an embodiment of the present invention.
Figure 11:
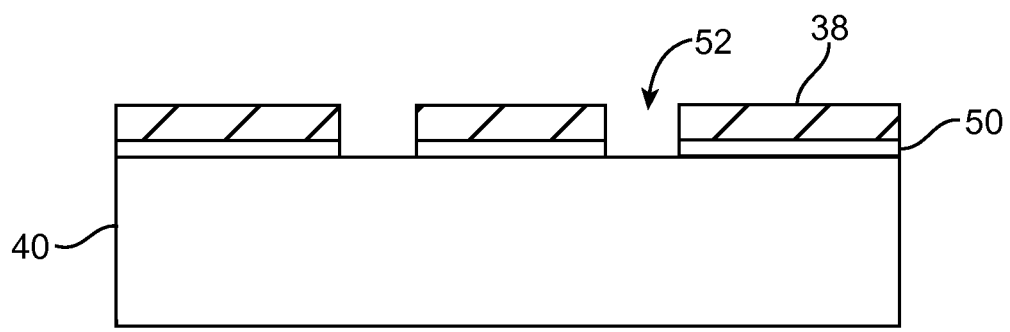
FIG. 11 is a cross-sectional side view of the shield and wireless circuit of FIG. 10 following attachment of the shield and patterning of the shield to form openings in accordance with an embodiment of the present invention.

As shown in FIG. 10, shield layer 38 (e.g., a metal foil layer or other metal sheet) may be attached to upper surface 114 of packaged circuitry 40 following patterning of insulating layer 50 to form openings such as openings 52. Insulating layer 50 may be, for example, a layer of pressure sensitive adhesive or other insulating material. Openings 52 may be formed by screen printing layer 50 onto the underside of shield layer 38, by etching a blanket film of adhesive, by exposing and developing a photo-imaging insulating layer, by stamping, laser cutting, or otherwise cutting a desired pattern in layer 50 before attaching layer 50 to the underside of layer 38, etc. Layer 38 may be a copper foil layer, a layer of other metals, or a sheet of other conductive material. Layer 38 and patterned layer 50 (e.g., a patterned layer of pressure sensitive adhesive) may be attached to upper surface 114 of packaged circuitry 40 in direction 112 (e.g., using a roller, using vacuum lamination equipment, using a press, or using other fabrication equipment). Following attachment of layer 38 to surface 114 of packaged circuitry 40, layer 38 may be patterned to produce patterned shield layer 38 of FIG. 11. Layer 38 may be patterned using photolithography (e.g., exposure and development of photoresist followed by wet or dry etching of metal shield layer 38), by laser cutting, by mechanical cutting, or using other fabrication techniques. As shown in FIG. 11, the layer 38 may be patterned to form openings that are aligned with (or at least partly overlap) openings 52 of insulating layer 50.

Figure 12:
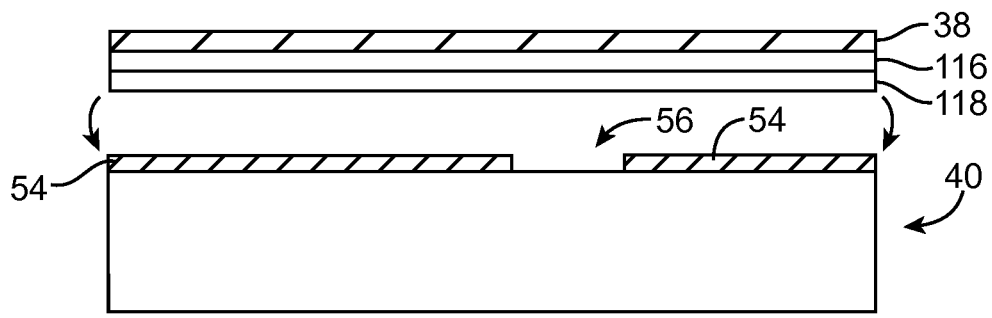
FIG. 12 is a cross-sectional side view of an illustrative shield on an insulator layer being attached to a packaged wireless circuit in accordance with an embodiment of the present invention.

As shown in FIG. 12, adhesive 118 may be used to attach an insulating layer such as insulating layer 116 to the upper surface of packaged circuitry 40. Shield layer 38 may be implemented using a layer of metal such as copper that is formed on the upper surface of insulating layer 116. Insulating layer 116 may be formed from a flexible sheet of polymer such as polyimide or other polymer materials. Shield layer 38 may be formed as a coating on layer 116. For example, shield layer 38 may be deposited as a coating on layer 116 using physical vapor deposition, electrochemical deposition, or other fabrication techniques. The thickness of shield layer 38 may be less than 0.5 mm, less than 0.05 mm, or less than 0.01 mm (as examples). Adhesive layer 118 may be formed on the underside of layer 116 to attach shield 38 and layer 116 to packaged circuitry 40. Layer 116 and metal coating layer 38 may, if desired, be dispensed from a roll while removing a removable release liner from adhesive layer 118. Adhesive layer 118 may be, for example, a layer of pressure sensitive adhesive.

Figure 13:
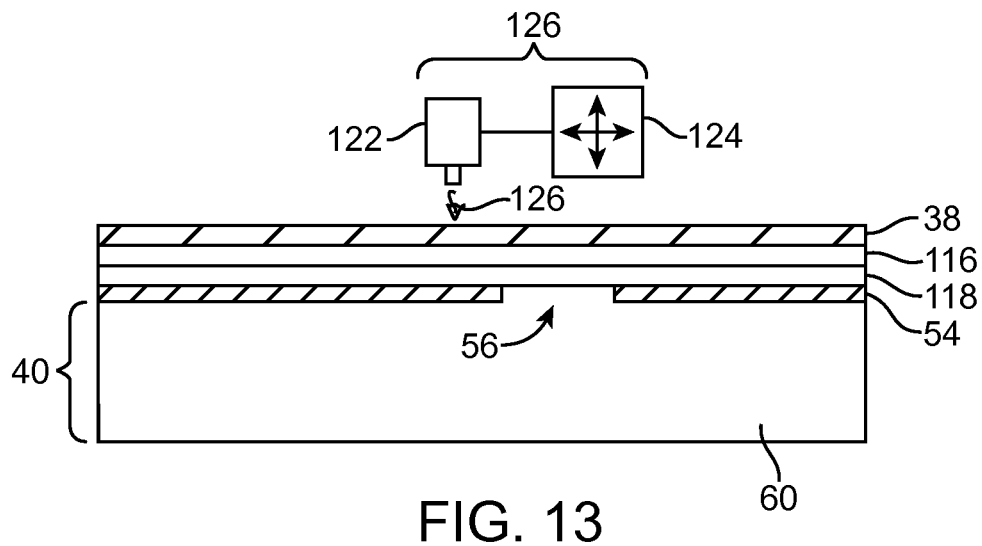
FIG. 13 a cross-sectional side view of the shield and wireless circuit of FIG. 12 during laser patterning of the shield to form vias in accordance with an embodiment of the present invention.

When mounted on packaged circuitry 40, layer 116 may be interposed between shield layer 38 and traces 54 on the upper surface of packaged circuitry 40 to enhance isolation between shield layer 38 and patterned traces 54 and other circuitry of packaged circuitry 40. As shown in FIG. 13, vias may be formed through layers 38, 116, and 118 following attachment of layers 38, 116, and 118 to packaged circuitry 40. Patterning equipment 120 may be used to form the vias in layers 28, 116, and 118.

Figure 14:
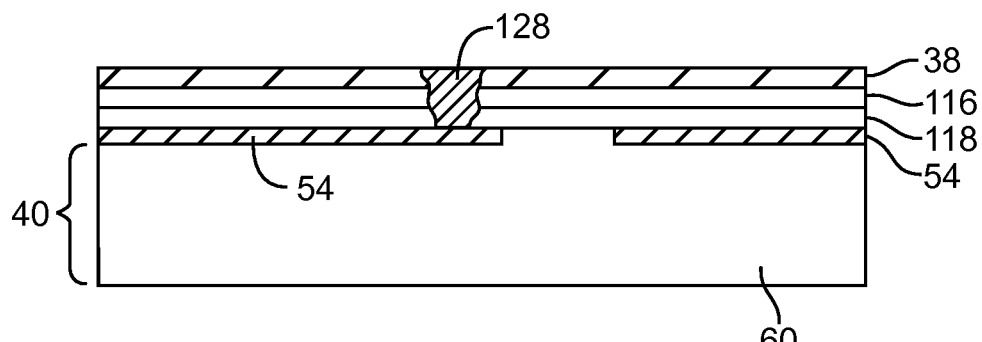
FIG. 14 is a cross-sectional side view of the shield and wireless circuit of FIG. 13 following via formation in accordance with an embodiment of the present invention.

Patterning equipment 120 may be, for example, computer-controlled laser processing equipment. Computer-controlled positioner 124 may be used to position laser 122 while laser 122 produces laser beam 126. Upon application of laser beam 126, vias may be formed through layers 38, 116, and 118 without removing underlying metal traces 54. The vias may be filled with conductive material 128 to form conductive (filled) vias of the type shown in FIG. 14. Conductive material 128 may be conductive adhesive (e.g., conductive epoxy), metal (e.g., electroplated copper or other metals), or other conductive material. Filled vias such as via 128 of FIG. 14 may pass through insulating layers 116 and 118 so that shield layer 38 is shorted to traces 54.

Figure 15:
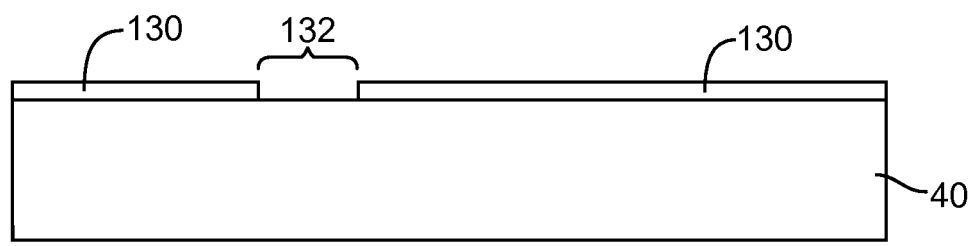
FIG. 15 is a cross-sectional side view of a packaged wireless circuit having a surface with patterned traces and a patterned insulating layer in accordance with an embodiment of the present invention.

If desired, shield layer 38 may be formed from conductive material that is deposited in the form of metallic paint (e.g., silver paint, or paint based on other metals). As shown in FIG. 15, packaged circuitry 40 may be covered with an insulating layer such as insulating layer 130. Insulating layer 130 may be, for example, a polymer layer such as a layer of solder mask material. Layer 130 may be patterned to form openings such as opening 132. Layer 130 may be deposited as a blanket film (using a dry solder mask material or a liquid material that is cured) and subsequently patterned (e.g., using photo-patterning techniques) or layer 130 may be deposited directly as a patterned layer (e.g., using screen printing).

Figure 16:
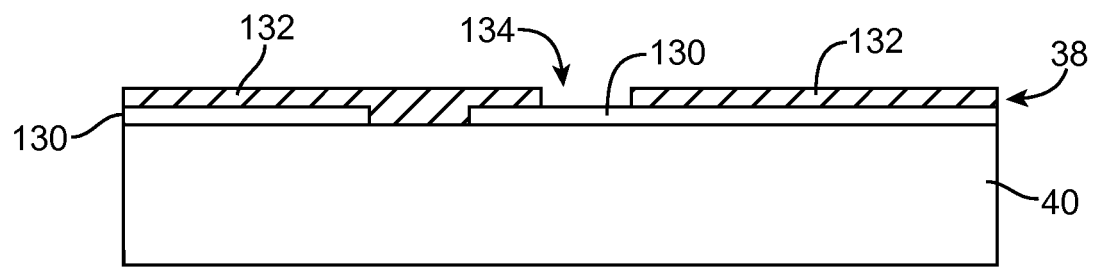
FIG. 16 is a cross-sectional side view of the packaged wireless circuit of FIG. 15 following formation of a shield layer using a deposition technique such as screen printing in accordance with an embodiment of the present invention.

Following formation of patterned insulating layer 130, conductive layer 132 may be deposited on insulating layer 130 to form shield layer 38, as shown in FIG. 16. Conductive layer 132 may be patterned to form openings such as opening 134. Conductive layer 132 may, for example, be deposited and patterned to form openings at the same time by depositing layer 132 using screen printing. Screen-printable conductive materials for forming layer 132 include metallic paints such as silver paint and other liquids with suspended conductive particles. Following drying, the metallic paint may form patterned conductive shield 38. If desired, other deposition techniques may be used for forming patterned layer 38 (e.g., ink-jet printing, pad printing, spraying, dipping, etc.).

Figure 17:
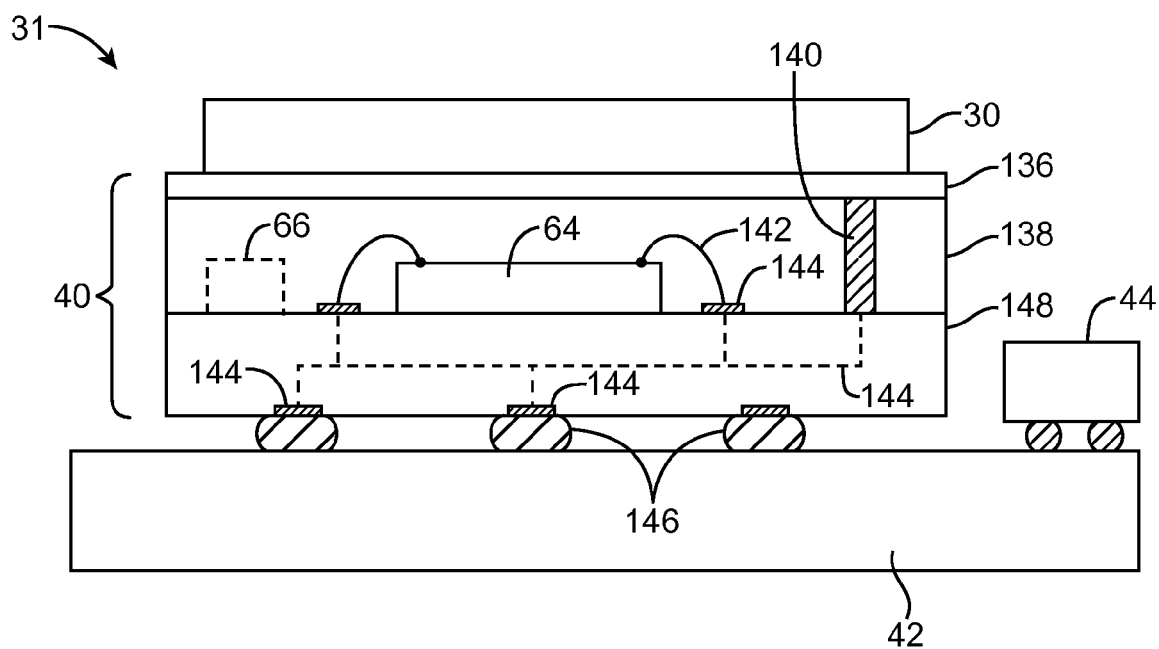
FIG. 17 is a cross-sectional side view of an illustrative antenna mounted to packaged wireless circuitry that is attached to a printed circuit board via wire bonding in accordance with an embodiment of the present invention.

FIG. 17 is a cross-sectional side view of wireless circuitry 31 in an illustrative configuration in which packaged circuitry 40 includes components such as component 64 and component 66 that have been embedded within a dielectric such as molded plastic 138. Molded plastic 138 may be used to encapsulate components 64 and 66 on a printed circuit substrate such as substrate 148. Antenna structures 30 may be mounted on top of packaged circuitry 40.

Molded plastic 138 may be an insulating material such as epoxy or other thermoset plastic encapsulation material. Substrate 148 may be a printed circuit substrate such as a rigid printed circuit board substrate (sometimes referred to as a printed circuit or interposer). Components such as components 64 and 66 may be mounted on printed circuit 148 prior to encapsulation with plastic 138. Conductors such as wires 142 may be used to interconnect the circuitry of components 64 and 66 to traces in printed circuit 148 such as traces 144. Wires 142 may be, for example, wire bonding wires each of which has one end that has been wire bonded to integrated circuit 64 and another end that has been wire bonded to a wire bonding pad in traces 144. Traces 144 may include pads on the underside of printed circuit 148 and may be used to route signals between wires 142 and printed circuit 42. Solder balls 146 or other conductive structures may be used in coupling the pad-shaped traces on printed circuit substrate 148 to traces in printed circuit 42. If desired, other components may be mounted to printed circuit 42 such as illustrative component 44.

A patterned conductive layer such as optional patterned metal layer 136 may be formed on the upper surface of packaged circuitry 40 (e.g., on top of polymer encapsulation layer 138). Vias such as conductive via 140 (e.g., vias filled with conductive adhesive, metal, or other conductive materials) may be coupled to terminals in antenna structures 30 directly or via interconnect traces in metal layer 136. The traces in metal layer 136, conductive vias such as via 140, and traces 144 in printed circuit substrate 148, and wire bonding wires 142 may be used in interconnecting the conductive structures of antenna structures 30 to circuitry 64 and circuitry 66. If desired, via 140 may be formed as through-mold via. Traces 144 may include pad-shaped structures that are coupled to solder balls 146, so that signals may be passed between circuitry 64 and 66 and circuitry on printed circuit 42 such as circuitry 44.

Figure 18:
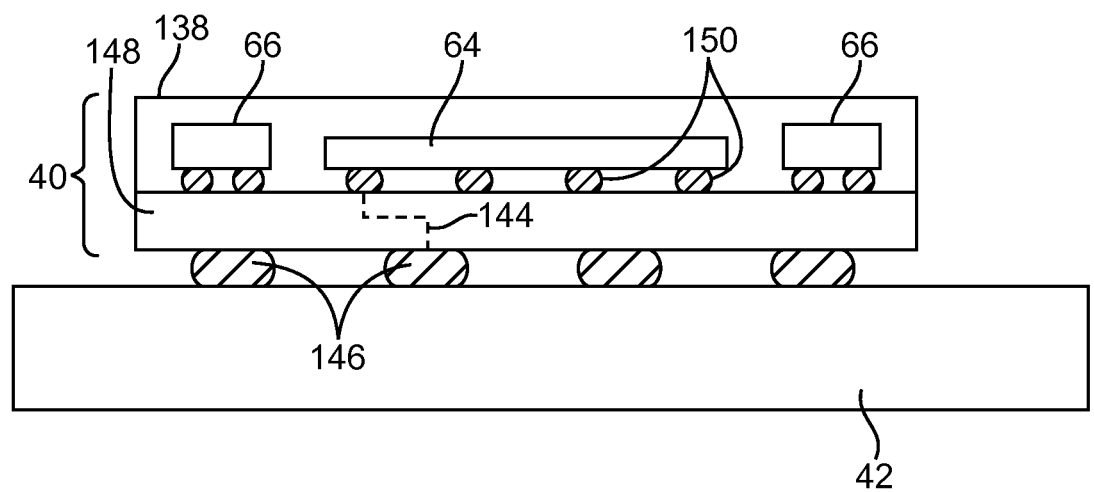
FIG. 18 is a cross-sectional side view of illustrative wireless circuitry having a flip-chip-mounted integrated circuit die in a packaged circuit that has been mounted on a printed circuit board in accordance with an embodiment of the present invention.

As shown in FIG. 18, packaged circuitry 40 may include solder balls such as solder balls 150. Electrical components 64 and 66 may be embedded within dielectric material such as molded plastic 138 on printed circuit 148. Solder balls 150 may be used to mount components 64 and 66 on printed circuit 148 in a flip-chip configuration in which components 64 and 66 are mounted face down so that pads on the surface of components 64 and 66 may be soldered to corresponding pads on the surface of printed circuit 148. Solder balls 146 may be used to interconnect traces 144 in packaged circuitry 40 to traces in printed circuit 42.

Figure 19:
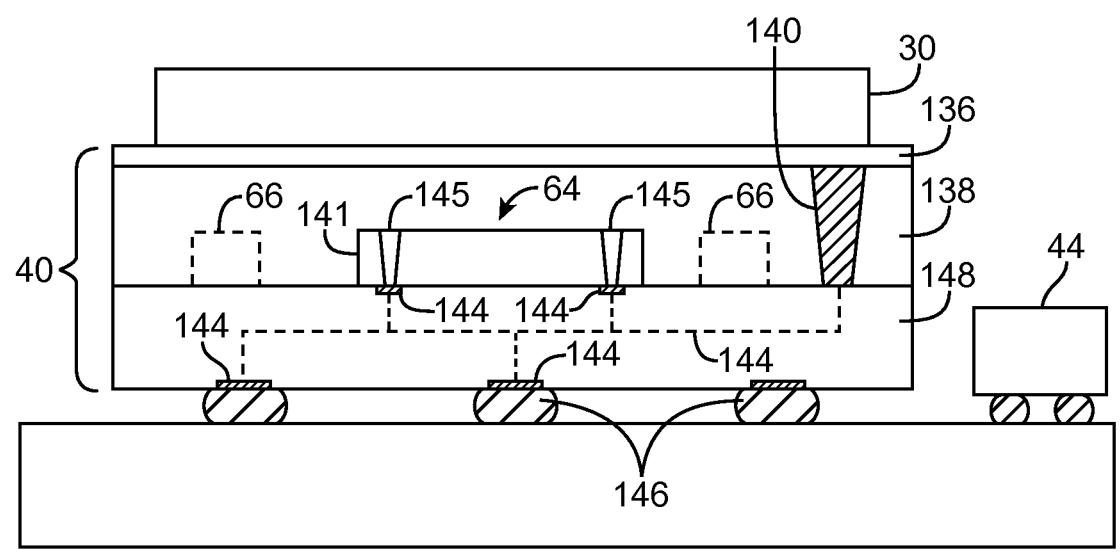
FIG. 19 is a cross-sectional side view of illustrative wireless circuitry having an integrated circuit with through-silicon vias that are used to electrically couple the integrated circuit to a package substrate in accordance with an embodiment of the present invention.

If desired, components such as integrated circuit die 64 having through-silicon vias (TSVs) may be mounted to printed circuit 148. As shown in FIG. 19, integrated circuit die 64 may include through-silicon vias 145 that provide electrical paths through a substrate 141 of integrated circuit die 64. Through-silicon vias 145 may couple circuitry (e.g., integrated circuit transistors) formed on a top surface of die 64 (e.g., on a surface of substrate 141 of integrated circuit die 64) to traces 144 of printed circuit substrate 148.

Figure 20:
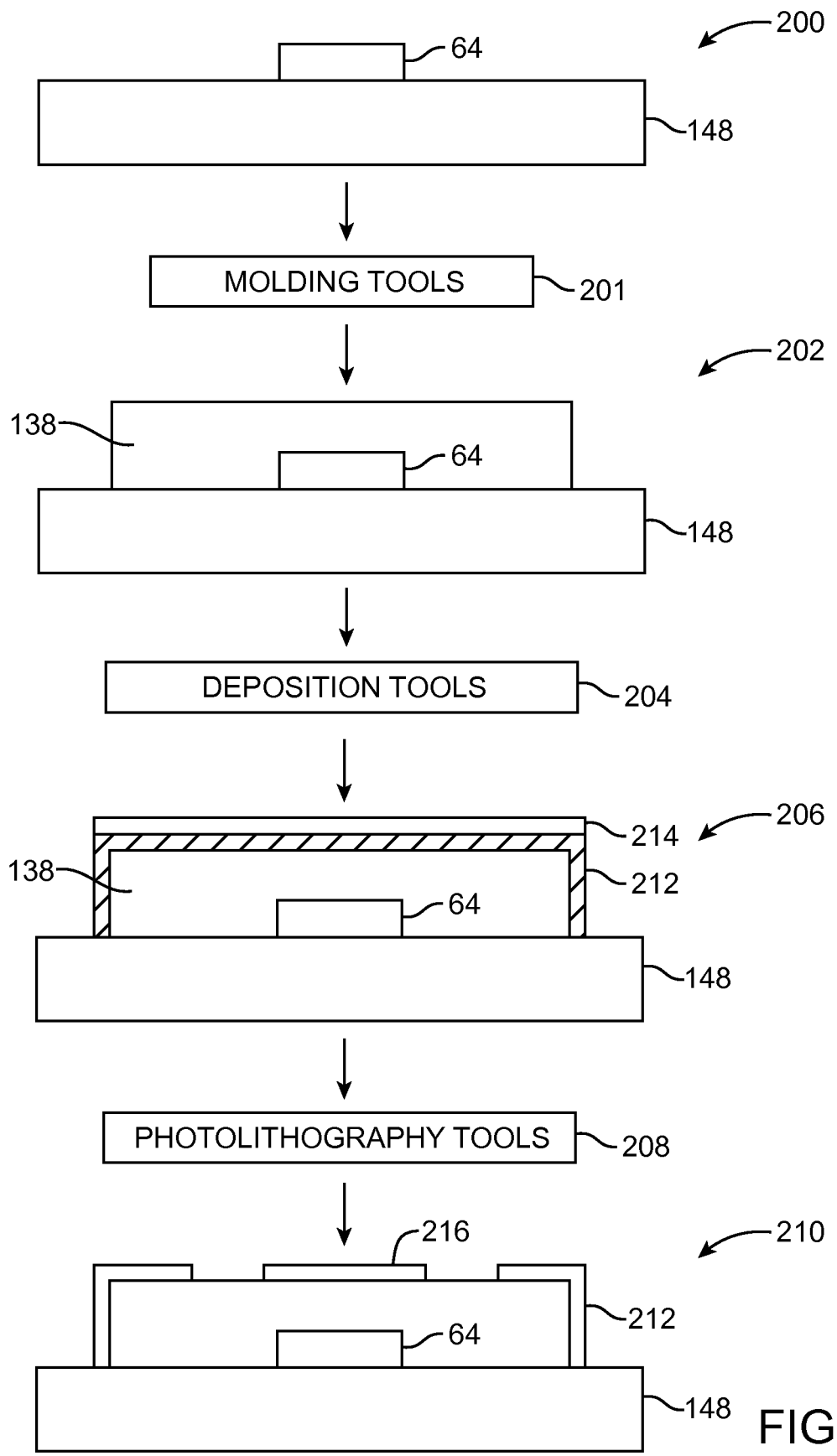
FIG. 20 is a flow chart of illustrative steps that may be performed to form a packaged circuit having antenna structures using photolithography tools in accordance with an embodiment of the present invention.

FIG. 20 is a flow chart of illustrative steps that may be performed to form antenna traces using photolithography. A component 64 (e.g., an integrated circuit die) mounted on a printed circuit 148 may initially be provided at step 200. Molding tools 201 may be used to form an insulating layer 138 (e.g., from a dielectric material) that covers and encloses component 64. Molding tools 32 may include injection molding tools, sintering tools, matrix molding tools, compression molding tools, transfer molding tools, extrusion molding tools, and other tools suitable for molding insulating materials into a desired configuration. For example, molding tools 201 may be used to injection mold a plastic material over component 64 to form layer 138. The example of FIG. 20 in which a single component 64 is enclosed by insulating layer 138 is merely illustrative. If desired, multiple components (e.g., integrated circuit components or discrete components) may be enclosed by insulating layer 138.

Deposition tools 204 may be subsequently used to deposit a layer of conductive material 212 over insulating layer 136. Conductive layer 212 may include copper, aluminum, gold, or any desired conductive materials. Deposition tools 204 may also be used to deposit a layer of photoresist 214 over conductive layer 212. Deposition tools 38 may include chemical deposition tools, physical deposition tools, or other deposition tools suitable for depositing materials such as conductive materials and photoresist materials. Photolithography tools 208 may then be used to pattern conductive layer 212 to form antenna traces 216. For example, photolithography tools 208 may expose regions of photoresist 214 to light and may subsequently performing etching processes to remove photoresist 214 and selected portions of underlying conductive layer 214 to form antenna traces 216.

Figure 21:
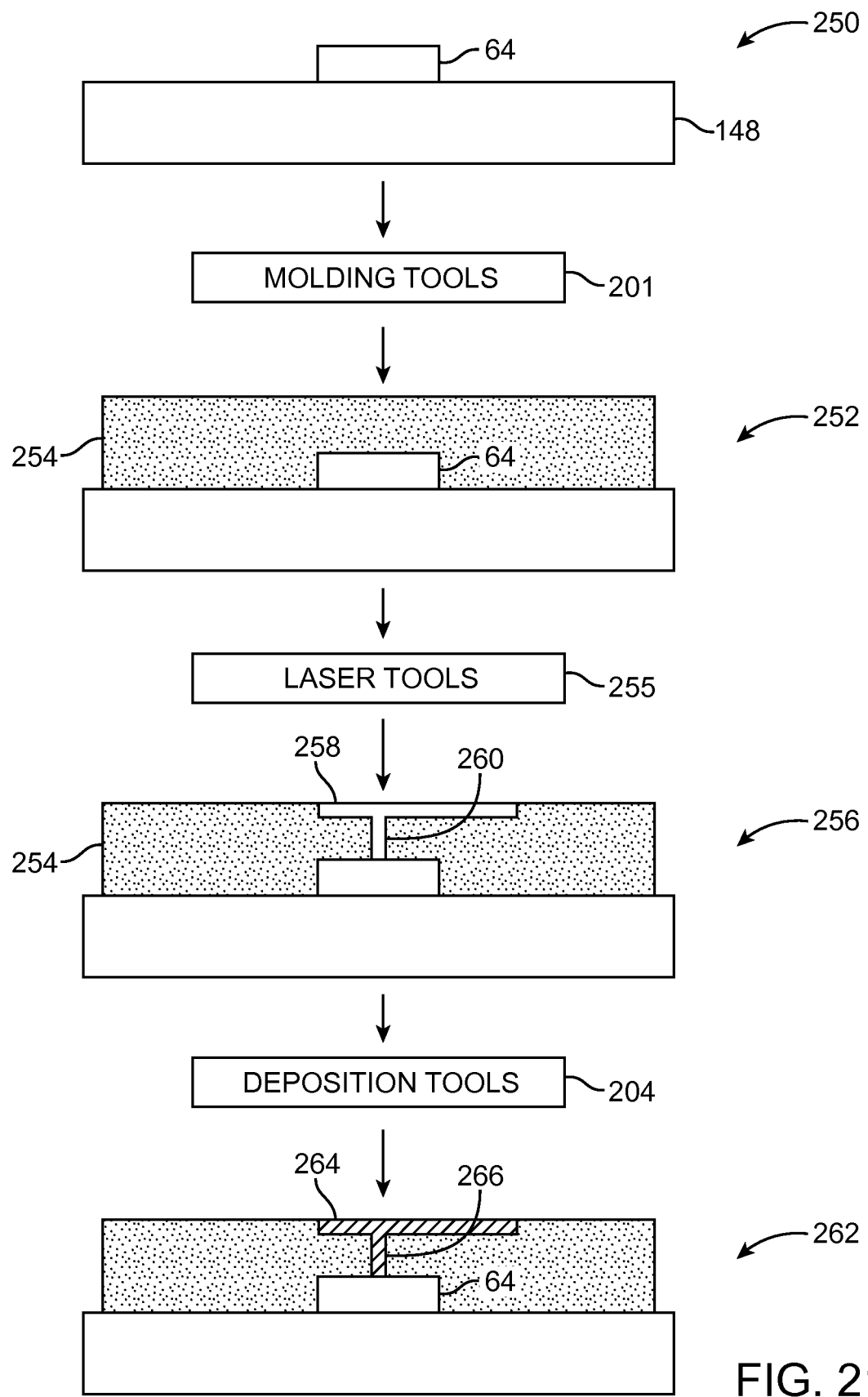
FIG. 21 is a flow chart of illustrative steps that may be performed to form antenna structures on a molded material using laser tools in accordance with an embodiment of the present invention.

If desired, laser direct structuring tools may be used to form antenna structures. Laser direct structuring tools may include laser tools, deposition tools, or other tools suitable for forming conductive traces on a dielectric structure using a laser. FIG. 21 is a flow chart of illustrative steps that may be performed to form antenna structures from a doped dielectric material. At initial step 250, a component 64 on a printed circuit 148 may be provided. Molding tools 201 may be used to form an insulating layer 254 that encapsulates component 64 at step 252. Insulating layer 254 may be formed from an insulating material (e.g., plastic) that has been doped with a catalyst such as palladium. For example, palladium may be dispersed throughout the insulating material of layer 254.

Laser tools 255 may be subsequently to activate the catalyst material in selected regions of insulating layer 254. For example, laser tools 255 may be used to pattern a top surface of insulating layer 254 to form activated region 258. In this scenario, activated region 258 may be referred to as a laser-activated region. If desired, laser tools 255 may be used to form one or more via openings 260 by cutting through portions of layer 254. Via openings 260 may be formed simultaneously with activation of region 258 or may be formed as a separate step.

Deposition tools 204 may then be used to form antenna traces 264 by depositing conductive materials over activated region 258 of doped insulating layer 254. For example, deposition tools 204 may be used to perform an electroless deposition process in which conductive materials (e.g., copper, silver, gold, nickel, etc.) may be deposited only over activated regions of doped insulating layer 254. In this scenario, the deposited conductive materials may cover activated region 258 to form antenna traces 264 and may also fill via 260 to form electrical connections between antenna traces 264 and component 64.

Figure 22:
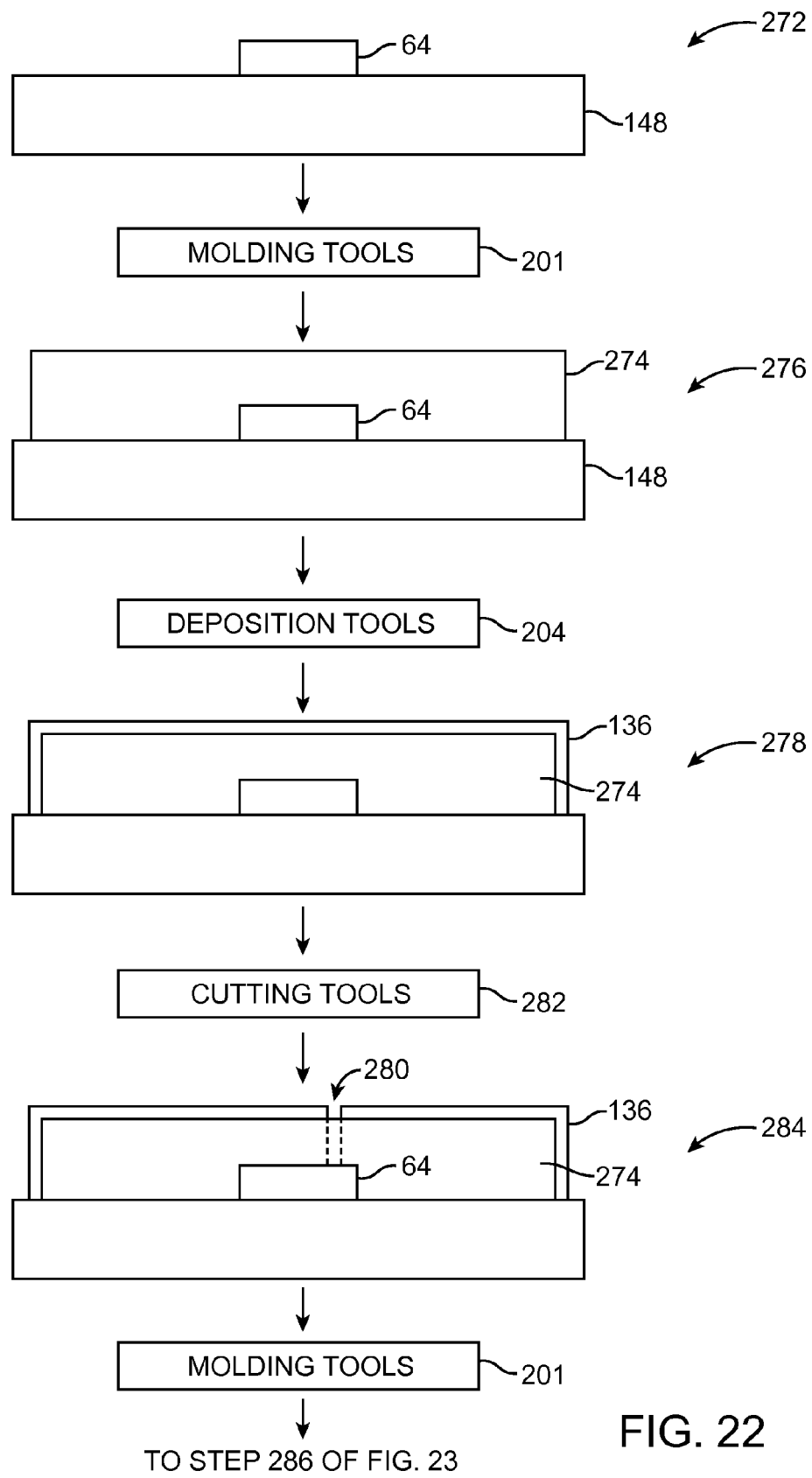
FIGS. 22-23 is a flow chart of illustrative steps that may be performed to form antenna structures over a component such as an integrated circuit component on a printed circuit substrate using a two-step molding process in accordance with an embodiment of the present invention.
Figure 23:
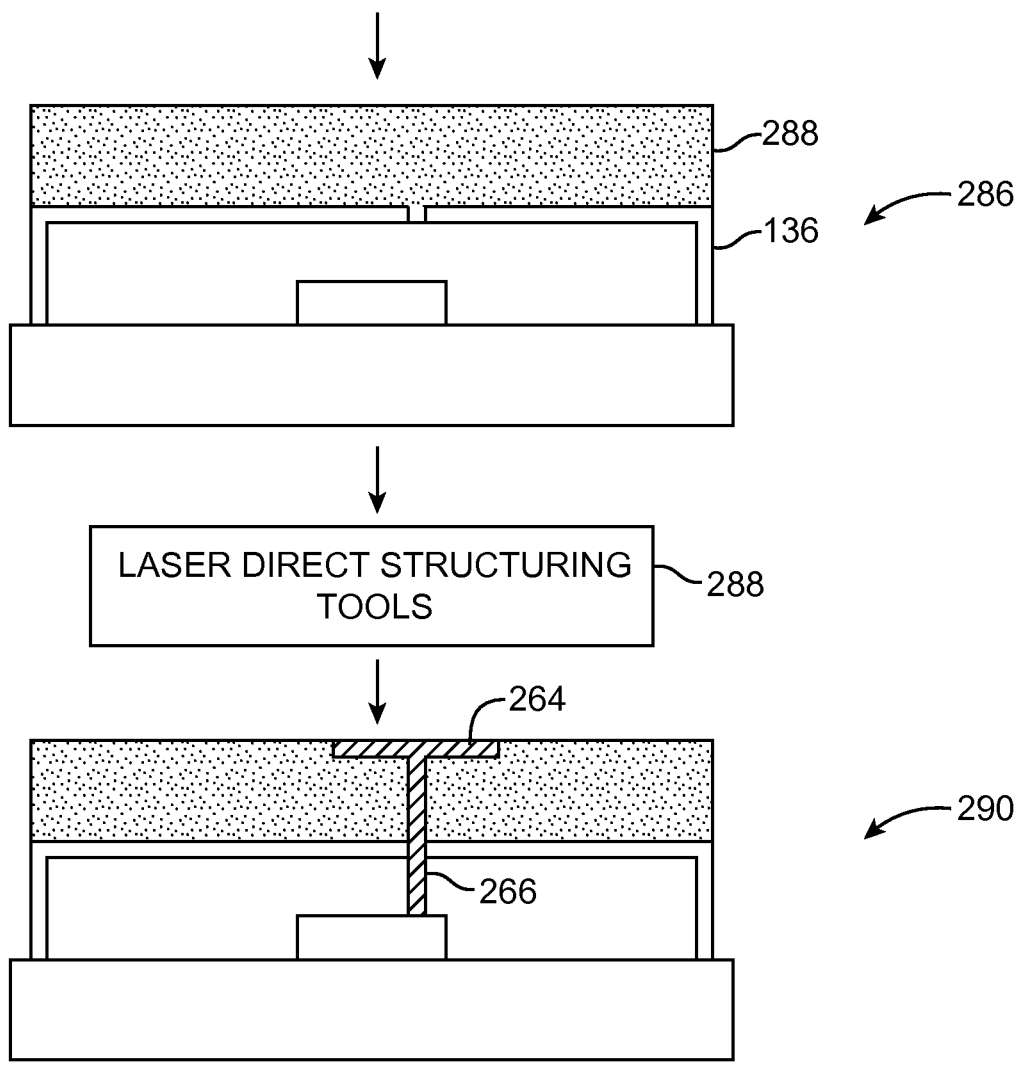

If desired, laser direct structuring tools and molding tools may be used to form a shielding structure for packaged components using multiple molding steps as shown in FIGS. 22 and 23. At initial step 272, a component 64 mounted on a substrate 148 may be provided. Molding tools 201 may be used to form an insulating layer 274 that covers component 64. Insulating layer 274 may be formed from any desired insulating material (e.g., dielectric materials such as plastics or other molding materials). If desired, insulating layer 274 may be formed from an undoped insulating material (e.g., a material that has not been doped with catalytic materials such as palladium) or a doped insulating material.

Deposition tools 204 may be subsequently used to form a shielding layer 136 (e.g., a layer of conductive material) that covers insulating layer 274 during step 278. Cutting tools 282 may then be used to form opening 280 in shielding layer 136 during step 284. Cutting tools 282 may, for example, include laser tools 255 (FIG. 21), sawing tools, grinding tools, drilling tools, electrical discharge machining tools, or other machining or cutting tools suitable for forming an opening in shielding layer 136. If desired, opening 280 may extend through insulating layer 274. For example, cutting tools 282 may be used to cut through shielding layer 136 and insulating layer 274 to expose a portion of component 64 such as a trace on a top surface of component 64.

In subsequent step 286, molding tools 201 may be used to deposit an insulating layer 288 that covers shielding layer 136. Insulating layer 288 may be a doped insulating layer 288 (e.g., an insulating layer 288 doped with catalytic materials such as palladium). Laser direct structuring tools 288 may then be used to form antenna structures 264 and one or more vias 266 during step 290. For example, laser direct structuring tools 288 may include laser tools 255 for activating regions of insulating layer 288 (e.g., to form laser-activated regions) and for forming via openings. Laser structuring tools 288 may also include deposition tools 204 such as electroless deposition equipment for depositing conductive material to form antenna structures 264 (e.g., over activated regions of insulating layer 288) and vias such as via 266.

Figure 24:
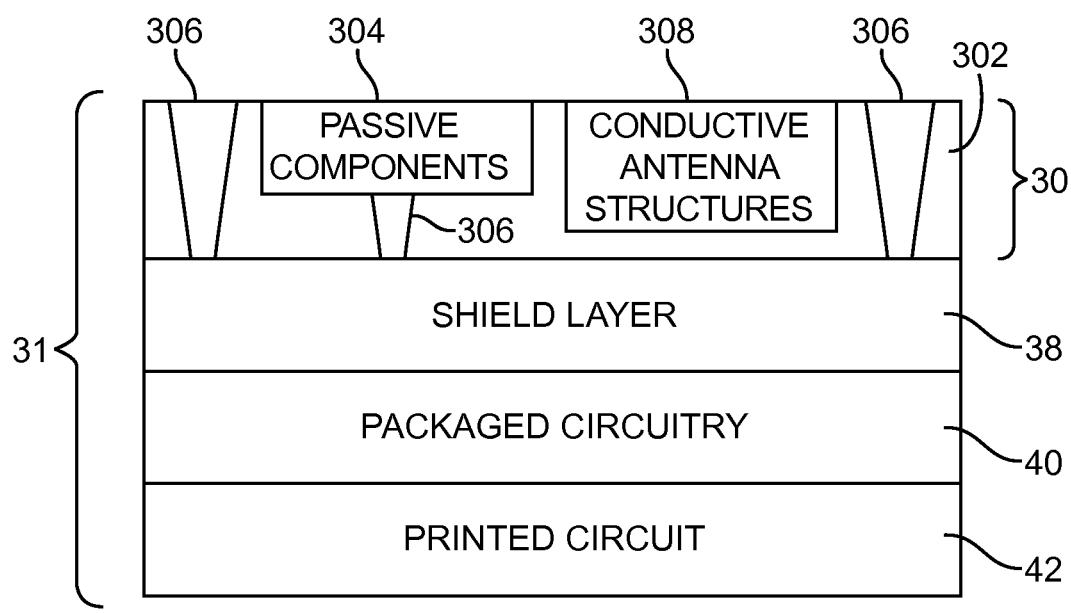
FIG. 24 is a cross-sectional side view of antenna structures that may include passive components and conductive antenna structures formed on a substrate in accordance with an embodiment of the present invention.

If desired, antenna structures 30 (FIG. 2) may be formed as an integrated passive device as shown in FIG. 24. Antenna structures 30 may include passive components 304 and conductive antenna structures 308 that are formed on a substrate 302. Substrate 302 may, for example, be a silicon substrate. Conductive antenna structures 308 may be formed by depositing one or more patterned layers of conductive material on substrate 302 (e.g., metals such as copper or other conductive materials). Passive components 304 may include circuitry such as matching and filter circuitry 28 (FIG. 1). For example, resistors, inductors, and/or capacitors of circuitry 28 may be formed directly in substrate 302. Conductive antenna structures 308 and passive components 304 may be coupled to shield layer 38 and/or packaged circuitry 40 by through-silicon vias (TSVs) 306.

By integrating matching and filter circuitry 28 with conductive antenna structures 308 on substrate 302, antenna performance may be improved. For example, matching circuitry 28 formed on substrate 302 may be more appropriately matched with antennas 308 in comparison with matching circuitry that is formed in packaged circuitry. As another example, power consumption may potentially be reduced (e.g., because the length of signal paths between matching circuitry 28 and conductive antenna structures 308 may be reduced).

The foregoing is merely illustrative of the principles of this invention and various modifications can be made by those skilled in the art without departing from the scope and spirit of the invention. The foregoing embodiments may be implemented individually or in any combination.

What is claimed is:

1. Apparatus, comprising:
packaged circuitry that includes at least one radio-frequency transceiver integrated circuit;
a shield layer on the packaged circuitry;
antenna structures on the shield layer;
a polymer layer interposed between the shield layer and the at least one radio-frequency transceiver integrated circuit, wherein the polymer layer overlaps the at least one radio-frequency transceiver integrated circuit, and wherein the shield layer is interposed between the polymer layer and the antenna structures; and
a via that extends through the shield layer, wherein the via electrically couples the antenna structures to the radio-frequency transceiver integrated circuit.

2. The apparatus defined in claim 1 further comprising a printed circuit to which the packaged circuitry is mounted.

3. The apparatus defined in claim 2 wherein the printed circuit comprises traces, the apparatus further comprising solder that couples the traces in the printed circuit board to the packaged circuitry.

4. The apparatus defined in claim 2 wherein the packaged circuitry comprises molded plastic that encapsulates the radio-frequency transceiver integrated circuit.

5. The apparatus defined in claim 4 wherein the packaged circuitry comprises a printed circuit substrate and wire bonding wires coupled between the radio-frequency transceiver integrated circuit and the printed circuit substrate.

6. The apparatus defined in claim 4 wherein the packaged circuitry comprises a printed circuit substrate and solder balls coupled between the radio-frequency transceiver circuitry and the printed circuit substrate.

7. The apparatus defined in claim 4 wherein the packaged circuitry further comprises a printed circuit substrate and wherein the radio-frequency transceiver integrated circuit comprises an integrated circuit substrate having through-silicon vias that are coupled to contacts on the printed circuit substrate.

8. The apparatus defined in claim 4 wherein the packaged circuitry further comprises an additional layer of molded plastic interposed between the shielding layer and the antenna structures.

9. The apparatus defined in claim 8 wherein the additional layer of molded plastic comprises a catalyst-doped plastic and wherein the antenna structures comprise antenna traces on laser-activated regions of the catalyst-doped plastic.

10. The apparatus defined in claim 9 wherein the catalyst-doped plastic comprises a plastic doped with palladium.

11. The apparatus defined in claim 8 wherein the via electrically couples the antenna structures to the radio-frequency transceiver integrated circuit through the molded plastic, the shielding layer, and the additional layer of molded plastic.

12. The apparatus defined in claim 2 wherein the packaged circuitry comprises a layer of resin on which the radio-frequency transceiver integrated circuit is mounted.

13. The apparatus defined in claim 2 wherein the packaged circuitry comprises a printed circuit board and wherein the at least one radio-frequency transceiver integrated circuit is embedded within the printed circuit board.

14. The apparatus defined in claim 1 wherein the shield layer comprises a metal layer, the apparatus further comprising a layer of adhesive that is interposed between the metal layer and the packaged circuitry and that attaches the metal layer to the packaged circuitry.

15. The apparatus defined in claim 1 wherein the shield layer comprises a metal coating on the polymer layer, the apparatus further comprising:
a layer of adhesive that attaches the polymer layer and the metal coating on the polymer layer to the packaged circuitry.

16. The apparatus defined in claim 15 wherein the antenna structures comprise at least one conductive trace in a ceramic support structure, wherein the shield layer comprises a layer of metal having at least one opening, and wherein the conductive trace of the antenna structures is coupled to the packaged circuitry by a conductive path that passes through the opening in the layer of metal.

17. The apparatus defined in claim 1 wherein the packaged circuitry includes a radio-frequency transceiver integrated circuit and impedance matching circuitry.

18. Wireless circuitry, comprising:
packaged circuitry including at least one integrated circuit die embedded in an insulating material, wherein the packaged circuitry has an upper surface, wherein the packaged circuitry comprises printed circuit board layers, wherein the integrated circuit die is mounted on an intermediate layer, and wherein the integrated circuit die and the intermediate layer are both embedded in a first printed circuit board layer interposed between two additional printed circuit board layers;
a metal shield layer on the upper surface of the packaged circuitry; and
antenna structures mounted on the metal shield layer, wherein the metal shield layer is interposed between the packaged circuitry and the antenna structures.

19. The wireless circuitry defined in claim 18 wherein the integrated circuit die comprises a radio-frequency transceiver.

20. The wireless circuitry defined in claim 19 wherein the antenna structures include a dielectric and at least one antenna resonating element trace.

21. The wireless circuitry defined in claim 20 wherein the metal shield layer includes an opening through which a conductive path passes that is coupled to the at least one antenna resonating element trace.

22. The wireless circuitry defined in claim 19 wherein the packaged circuitry comprises a rigid printed circuit board substrate.

23. The wireless circuitry defined in claim 22 further comprising conductive vias that pass through the printed circuit board layers.

24. The wireless circuitry defined in claim 22 further comprising an edge conductor on an edge of the printed circuit board layers.

25. Wireless circuitry, comprising:
antenna structures having at least one antenna terminal;
packaged circuitry including at least one circuit component embedded within a dielectric;

a metal shield layer interposed between the antenna structures and the packaged circuitry; and a layer of non-conductive adhesive interposed between the metal shield layer and the dielectric, wherein the layer of non-conductive adhesive is configured to attach the metal shield layer to the packaged circuitry, and wherein the layer of non-conductive adhesive at least partially overlaps the at least one circuit component and comprises openings through which the metal shield layer is electrically coupled to conductive traces on the dielectric.

26. The wireless circuitry defined in claim 25 wherein the dielectric comprises a polymer with an upper surface, wherein the metal shield layer comprises a coating on a polymer layer and wherein the layer of non-conductive adhesive attaches the metal shield layer to the packaged circuitry by attaching the polymer layer to the upper surface.

27. The wireless circuitry defined in claim 25 wherein the packaged circuitry comprises a rigid printed circuit board substrate having printed circuit board layers and wherein the integrated circuit die is interposed between two of the printed circuit board layers.

28. The wireless circuitry defined in claim 27 wherein the antenna structures comprise a ceramic support structure mounted over the metal shield layer.

29. The wireless circuitry defined in claim 25 wherein the layer of non-conductive adhesive is a layer of pressure sensitive adhesive.

* * * * *